United States Patent
Tokie et al.

(10) Patent No.: US 7,763,114 B2
(45) Date of Patent: Jul. 27, 2010

(54) ROTATABLE APERTURE MASK ASSEMBLY AND DEPOSITION SYSTEM

(75) Inventors: Jeffrey H. Tokie, Scandia, MN (US); Donald J. McClure, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 987 days.

(21) Appl. No.: 11/275,354

(22) Filed: Dec. 28, 2005

(65) Prior Publication Data

US 2007/0163494 A1    Jul. 19, 2007

(51) Int. Cl.
- C23C 16/00    (2006.01)
- C23F 1/00    (2006.01)
- H01L 21/306    (2006.01)
- B05B 15/04    (2006.01)

(52) U.S. Cl. ............... 118/718; 156/345.2; 204/298.24; 118/301

(58) Field of Classification Search ................. 118/718, 118/301; 204/298.24; 156/345.2
See application file for complete search history.

(56) References Cited

U.S. PATENT DOCUMENTS

| | | | |
|---|---|---|---|
| 2,948,261 A | 8/1960 | McGraw, Jr. | |
| 3,669,060 A | 6/1972 | Page et al. | |
| 3,735,728 A | 5/1973 | Krumme et al. | |
| 3,866,565 A * | 2/1975 | Ridout | 118/718 |
| 3,885,520 A | 5/1975 | Krumme | |
| 4,096,821 A | 6/1978 | Greeneich et al. | |
| 4,335,161 A | 6/1982 | Luo | |
| 4,344,988 A | 8/1982 | Sono et al. | |
| 4,451,501 A | 5/1984 | Nagao et al. | |
| 4,492,180 A | 1/1985 | Martin | |
| 4,549,843 A | 10/1985 | Jagusch et al. | |
| 4,681,780 A * | 7/1987 | Kamman | 427/282 |
| 4,746,548 A | 5/1988 | Boudreau et al. | |
| 4,777,909 A | 10/1988 | Martin | |
| 4,915,057 A | 4/1990 | Boudreau et al. | |
| 4,945,252 A | 7/1990 | Lerner et al. | |
| 5,026,239 A | 6/1991 | Chiba et al. | |
| 5,076,203 A | 12/1991 | Vaidya et al. | |
| 5,211,757 A | 5/1993 | Mounoussamy et al. | |

(Continued)

FOREIGN PATENT DOCUMENTS

JP    59-006372    1/1984

(Continued)

OTHER PUBLICATIONS

U.S. Appl. No. 11/179,418, filed Jul. 12, 2005, "Apparatus and Methods for Continuously Depositing a Pattern of Material onto a Substrate", now pending.

(Continued)

*Primary Examiner*—Michael Cleveland
*Assistant Examiner*—Nathan K Ford

(57) ABSTRACT

An aperture mask assembly includes a rotatable frame and a mask having apertures. A clamping arrangement is used to tension the mask and to conform the mask to a shape defined by the frame. Tension is applied to the mask in a direction substantially parallel to an axis of the frame and/or around the circumference of the shape defined by the frame. Deposition material emanating from a deposition source located within the rotatable frame is deposited through the mask apertures onto a web.

8 Claims, 9 Drawing Sheets

U.S. PATENT DOCUMENTS

| | | | |
|---|---|---|---|
| 6,309,466 B1 | 10/2001 | Klemm et al. | |
| 6,440,277 B1 | 8/2002 | D'Amato | |
| 6,475,287 B1 | 11/2002 | Clark | |
| 6,709,962 B2 | 3/2004 | Berg | |
| 6,746,946 B2 | 6/2004 | Berg | |
| 6,759,348 B1 | 7/2004 | Cho et al. | |
| 6,821,348 B2 | 11/2004 | Baude et al. | |
| 6,897,164 B2 | 5/2005 | Baude et al. | |
| 6,943,066 B2 | 9/2005 | Brody et al. | |
| 2003/0150384 A1* | 8/2003 | Baude et al. | 118/721 |
| 2003/0151118 A1 | 8/2003 | Baude et al. | |
| 2004/0123799 A1 | 7/2004 | Clark | |
| 2004/0202821 A1 | 10/2004 | Kim et al. | |
| 2005/0008778 A1 | 1/2005 | Utsugi et al. | |
| 2005/0031783 A1 | 2/2005 | Brody et al. | |
| 2005/0042365 A1 | 2/2005 | Baude et al. | |
| 2005/0087578 A1 | 4/2005 | Jackson | |
| 2005/0106986 A1 | 5/2005 | Cok et al. | |

FOREIGN PATENT DOCUMENTS

| | | |
|---|---|---|
| JP | 59-006372 A | 1/1984 |
| JP | 09-027454 | 1/1997 |
| JP | 2000-138203 | 5/2000 |
| WO | WO 2005/024965 A1 | 3/2005 |

OTHER PUBLICATIONS

Communication—extended European search report and Annex to the extended European search report in foreign counterpart Appl. No./ Pat. No. 06839313.1-1215/ 1961037 PCT/US2006047292, dated Jun. 9, 2009.

* cited by examiner

ROTATABLE APERTURE MASK ASSEMBLY AND DEPOSITION SYSTEM

TECHNICAL FIELD

The present invention is related to a rotatable aperture mask assembly and system for depositing a pattern of material on a web-based substrate.

BACKGROUND

Patterns of material may be formed on a web-based substrate through the use of an aperture mask or stencil. The aperture mask is positioned between the web and a deposition source. Material from the deposition source is directed toward the substrate and passes through apertures of the mask, continuously forming a pattern on the web that corresponds to the pattern of the apertures.

Such patterns may be deposited on the web for various purposes. As one example, circuitry may be formed on the web by sequentially depositing materials through mask patterns to form circuit layers. Aperture masks may be used to form a wide variety of circuits and electronic devices, including discrete and integrated circuits, liquid crystal displays, organic light emitting diode displays, among others. Formation of small geometry circuit elements involves accurate alignment and position control of the web and the aperture mask. The present invention fulfills these and other needs, and offers other advantages over the prior art.

SUMMARY

Embodiments of the present invention are directed to an aperture mask assembly. The assembly includes a rotatable frame and a mask with apertures. The assembly further includes a clamping arrangement configured to tension the mask and to conform the mask to a shape defined by the frame. Apertures of the mask are aligned with an opening in the frame, allowing deposition from a source within the frame onto a web disposed external to the frame.

In one implementation, the shape of the frame is substantially cylindrical. The frame may include two end structures and one or more beams coupling the end structures. The clamping arrangement may be configured to tension the mask along an axis substantially parallel to an axis of the frame and/or to tension the mask around the circumference of the frame.

According to one configuration, the clamping arrangement includes one or more clamps positioned on one or both end structures. The clamps are used to clamp an edge of the mask and also to tension the mask along a direction substantially parallel to an axis of the frame.

According to another configuration, the clamping arrangement includes a clamping element configured to clamp an edge of the mask between the clamping element and the frame. In this configuration, the clamping arrangement also includes a mechanism configured to tension to the mask along a direction substantially parallel to an axis of the frame.

The clamping arrangement may include clamps positioned along a perimeter of at least one of the end structures. The clamps positioned along the frame end structures clamp an edge of the mask and tension the mask along a direction substantially parallel to an axis of the frame. The clamping arrangement may include clamps positioned along at least one of the beams. The clamps on the beams are used to clamp an end of the mask and to tension the mask around a circumference of the frame. The clamps may be configured to apply tension to the mask by adjusting a position of the clamp, such as a rotational position.

In some implementations, the mask is a flexible polymeric mask having apertures that allow deposition of a material through the apertures.

Another embodiment of the invention involves a deposition system. The deposition system includes a chamber having at least a deposition region. A rotatable frame assembly is disposed within the chamber. The frame assembly includes a frame and a mask having one or more apertures. The frame assembly also includes a clamping arrangement configured to tension the mask and to conform the mask to a shape defined by the frame. A web drive mechanism is disposed within the chamber and is configured to move a web in relation to a deposition source to allow deposition of a material from the deposition source onto the web through the apertures of the mask. In some implementations, the mask is removable from the frame. In some implementations, the frame assembly is removable from the deposition chamber.

The deposition source is positioned within the frame. Openings in the frame are aligned with apertures of the mask, allowing deposition of material from the deposition source through the mask apertures. The deposition source may comprise various types of sources such as an e-beam deposition source, thermal evaporation source, sputter cathode source, a vapor deposition source, including a Plasma Enhanced Chemical Vapor Deposition (PECVD) source, or other source types.

According to one implementation, the chamber includes a cleaning region. In this implementation, the frame rotates within the deposition region and the cleaning region of the chamber. A cleaning source positioned within the cleaning region provides for cleaning of the rotatable frame assembly including the frame and aperture mask. The cleaning source may be positioned in an interior region of the frame.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1A:
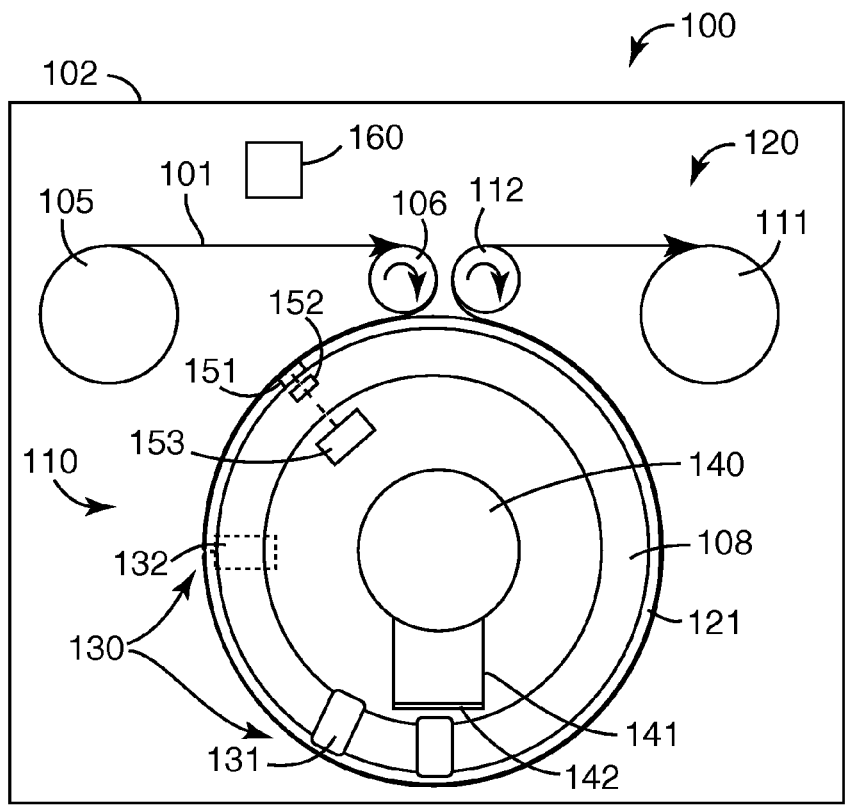
FIG. 1A illustrates a deposition system suitable for deposition of a pattern on a web using a rotatable aperture mask assembly in accordance with an embodiment of the invention.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following description of the illustrated embodiments, reference is made to the accompanying drawings that form a part hereof, and in which are shown by way of illustration, various embodiments in which the invention may be practiced. It is to be understood that the embodiments may be utilized and structural changes may be made without departing from the scope of the present invention.

Deposition systems and aperture mask assemblies according to the present invention may include one or more of the features, structures, methods, or combinations thereof described in the embodiments below. For example, an assembly or system may be implemented to include one or more of the advantageous features and/or processes described below. It is intended that such an assembly or system need not include all of the features described herein, but may be implemented to include selected features that provide for useful structures and/or functionality.

Embodiments of the present invention are directed to assemblies and systems used for deposition of a pattern of material on a web-based substrate using a rotatable aperture mask. A web-based substrate may be configured in a wound roll and fed so as to provide a longitudinal surface for coating. It is typical in the industry to refer to such elongated substrate as a web. FIG. 1A illustrates deposition system 100 suitable for deposition of a pattern on a web through an aperture mask 121. The system 100 includes a deposition chamber 102 enclosing a rotatable aperture mask assembly 110, a web transport system 120, and a deposition source 140. The web transport system 120 moves the web 101, in relation to the deposition source 140 during the deposition process. The web 101 is arranged on a unwind roller 105 that delivers the web 101 to the remainder of the deposition system 100. In this embodiment, the web 101 travels over a first idler roller 106, around a portion of a circumference of a frame 108, over a second idler roller 112, and is collected by a wind roller 111. Various alternative arrangements for the web transport system are possible and are considered to be within the scope of the present invention.

The deposition system 100 of FIG. 1A illustrates a single chamber deposition system. Alternatively, a system similar to the one illustrated may be used as one stage in a multi-chamber deposition system. In such an alternative arrangement, in place of the unwind roller 105, the web 101 may enter the deposition system 100 from a preceding deposition stage. In place of the wind roller 111, the web substrate 101 may depart the deposition system 100 for a subsequent deposition stage.

The frame 108 includes a rotating drum or structural skeleton for supporting and rotating the aperture mask 121. The frame 108 includes at least one opening. The aperture mask 121 conforms around a circumference of the shape defined by the frame 108, which may be cylindrical, rectangular, octagonal, or other shape. The aperture mask 121 includes a pattern of one or more apertures that correspond to a pattern to be formed on the web 101 by the deposition material. The aperture mask pattern is aligned with an opening in the frame 108 to allow deposition material to flow from the deposition source 140 positioned within the interior of the frame 108 through the frame opening and through the mask apertures to the surface of the web 101.

In various implementations, the frame 108 and mask 121 may be aligned using capacitive, magnetic, or optical sensors. For example, in one embodiment, the aperture mask 121 is aligned relative to a position on the frame 108 using mask fiducials 151 on the mask 121 and frame fiducials 152 on the frame 108. Registration between the mask and frame fiducials 151, 152 is used to position the mask 121 relative to a known location on the frame 108. One or more mask sensors 153, which may comprise photodetectors, cameras, or other types of optical sensors, may be used to align fiducials 152 on the frame 108 relative to corresponding fiducials 151 on the mask 121. The fiducials 151, 152 on the frame 108 and/or mask 121 may be formed by any process that provides a discernible reference, such as through deposition of material, removal of material to create openings or voids, trimming an edge, and/or by changing the physical, optical, chemical, magnetic and/or other properties of a material to produce a reference.

FIG. 1A illustrates the use of one or more mask sensors 153, e.g., photodiode/photodetector circuits or cameras, for fiducial alignment of the mask 121 and frame 108. In this implementation at least one mask sensor 153 is positioned in the interior of the frame 108. The mask sensor 153 is used to align the fiducials 151 on the mask 121 with corresponding fiducials 152 on the frame 108 during an initial alignment process. The initial alignment process may be facilitated by computer with closed loop feedback control involving alignment of a number of fiducials 151 on the mask 121 and 152 on the frame 108. In other embodiments, one or more mask sensors 153 may be additionally or alternatively positioned exterior to the frame 108.

FIG. 1A illustrates one or more web sensors 160 which may be used to control the position of the web 101. Longitudinal (machine-direction) timing or elongation of the web 101, and/or lateral (cross web) positioning of the web 101 may be accomplished using markings on the web 101 that are sensed by the web sensors 160. The web markings may comprise cyclic marks, lines, voids, trimmed web edges, or any other reference used to determine the position of the web 101. Longitudinal markings, which can be cyclic marks, may be used for determining the down-web longitudinal location of the web 101. Longitudinal markings may be used in timing the arrival of patterns on the web 101 in synch with patterns on the mask 121 to provide proper registration between previously deposited patterns on the web 101 and the aperture mask pattern.

Lateral markings, which may be a line in the margin of the web 101 or a trimmed web edge, for example, are useful for controlling the lateral position of the web 101. Web sensors 160 may include separate sensors for detecting the lateral web markings and the longitudinal web markings.

The aperture mask assembly 110 includes a clamping arrangement 130 used to tension the aperture mask 121 around the shape defined by frame 108. In one embodiment, the clamping arrangement 130 includes one or more mask edge clamps 131 and one or more mask end clamps 132. Although FIG. 1A illustrates two edge clamps 131, and one end clamp 132, any number of edge clamps 131 may be used. In one configuration a number of edge clamps 131 are disposed around the perimeters of one or both ends of the frame 108. In one configuration, a number of end clamps 132 are disposed along one or more beams disposed between the ends of the frame 108.

Tensioning the mask 121 may be accomplished by adjusting the position of clamps 131, 132. Tension may be applied to the mask 121 in a direction substantially parallel to an axis of the frame 108 and/or around the circumference of the frame 108. Tensioning the mask 121 in a direction substantially parallel to a frame axis may involve adjusting the position of one or more of the mask edge clamps 131. Tensioning the mask 121 around the circumference of the frame 108 may involve adjusting the position of one or more mask end clamps 132. Adjustment of the clamps 131, 132 to tension the mask 121 can be performed manually, or may involve the use of a computerized system using drivers and feedback sensors to adjust the position of one or more of the clamps 131, 132 to achieve a desired mask tension and fiducial location. In such a system, feedback control signals from mask tension sensors and/or mask fiducial sensors 153 may be used to control automated drivers for adjusting the position of the clamps 131, 132 to achieve a desired mask tension and relative position. The automated drivers do not need to be self contained on the clamps 131, 132.

The rotatable aperture mask assembly 110 may be removable from the deposition chamber 102 for maintenance, cleaning, and/or to remove masks 121 from the frame 108 and install new masks 121.

The deposition source 140 is positioned within the frame 108. In the configuration illustrated in FIG. 1A, the deposition source 140 emits deposition material downward, opposite the idler rollers 106, 112. As deposition material emanates from the deposition source 140, the deposition material travels through an opening in the frame 108 and through apertures of the mask 121. The deposition material coats the web 101 in a pattern corresponding to the pattern of apertures of the mask 121. A shield 141 may be used to prevent material deposition in locations other than a desired region at the apex of the cylindrical frame 108. A shutter 142 may be used to block the source material from the web 101 to prevent premature deposition as the web 101 approaches the deposition position. It will be appreciated that the components of the deposition system 100, including the idler rollers 106, 112, deposition source 140, unwind and wind rollers 105, 111, and/or other components, may be arranged in other configurations. For example, the deposition system 100 may be arranged so that the deposition material is emitted upward, or along trajectories other than the downward direction illustrated in FIG. 1A.

Other locations for the idler rollers 106, 112, and/or unwind and wind rollers 105, 111 are also achievable.

The deposition source 140 used depends on the type of deposition process and the type of deposition material desired. The deposition source 140 may be configured as a vacuum or non-vacuum deposition source capable of providing deposition material in liquid or gaseous form. In various implementations, the deposition material may be deposited by e-beam deposition, thermal evaporation, sputtering, chemical vapor deposition, including plasma enhanced chemical vapor deposition, spraying, printing, or other types of deposition processes. In some deposition systems, multiple deposition sources are used.

Deposition sources 140 may be removed from the deposition chamber 102 and replaced to accommodate different types of deposition processes and/or different types of deposition materials. For example, the deposition source 140 may be a sputtering cathode or magnetron sputtering cathode for purposes of depositing metal, metal oxide, metal nitride, or semiconducting materials. As another example, the deposition source 140 may be an evaporation source for purposes of depositing organic, metal, metal oxide, metal nitride, or semiconducting materials.

Figure 1B:
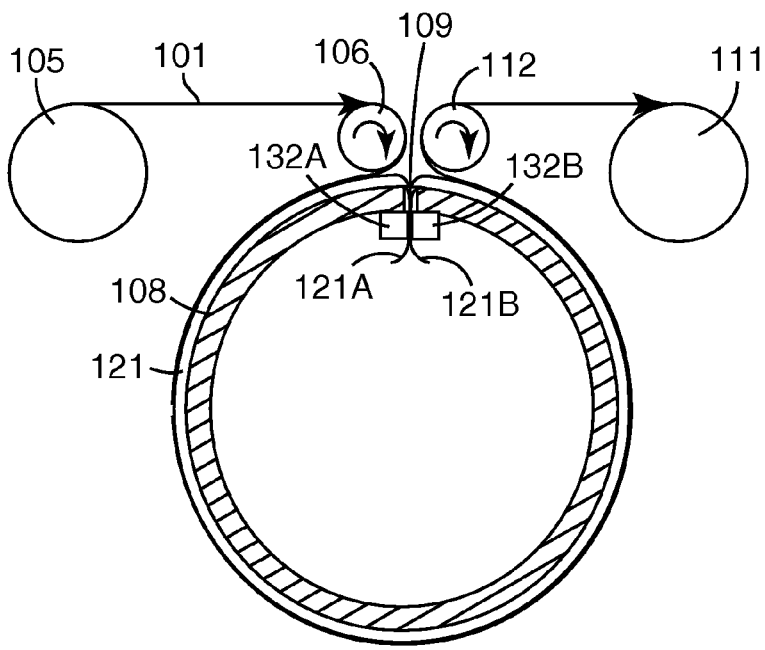
FIG. 1B shows a cross section of an aperture mask assembly illustrating a slot in the frame used for allowing ends of the web to be inserted into the frame and clamped by end clamps in accordance with an embodiment of the invention.

FIG. 1B shows a cross section of the rotatable aperture mask assembly 110 illustrating a slot 109 in the frame 108 that allows mask access to the mask end clamps 132A-B. The mask end clamps 132A-B are positioned within the interior of the frame 108 along beams between the frame end structures. In one embodiment, ends 121A-B of the aperture mask 121 are inserted through the slot 109 in the frame 108 and are secured by the mask end clamps 132A-B. In one embodiment, a first end 121A of the mask is secured by clamp 132A positioned on one side of slot 109. A second end 121B of the mask is secured by clamp 132B positioned on another side of slot 109.

The web 101 and/or the aperture mask 121 may be made of various types of materials. Examples include polymeric materials, such as Kapton, purchasable from DuPont Teijin Films, polyester, poly(ethyleneterephthalate) (PET), poly (ethylenenaphthalate) (PEN), polyimide, polycarbonate, polystyrene, metal foil materials, such as stainless steel, or other steels, aluminum, copper, paper, woven or non-woven fabrics, or combinations of the above materials with or without coated surfaces. In one embodiment, the material used for the web 101 is Kapton E having a thickness of 1 mil.

Deposition via aperture masks can be particularly useful in creating circuits for electronic displays, such as light emitting diodes displays and liquid crystal displays, solar cell arrays, low-cost integrated circuits such as radio frequency identification (RFID) circuits, or any circuit that implements thin film components, such as thin film transistor (TFT) circuits and/or organic light emitting diode (OLED) constructions. The deposition systems described herein may be particularly useful in the formation of circuits including components comprising organic or inorganic semiconductors. The use of deposition systems, such as the deposition system 100 illustrated in FIG. 1A provides the capability to deposit all layers for these electronic devices and/or other electronic devices. Material may be deposited in one or more layers on the web 101 to form circuit elements and/or circuits, including combinations of resistors, diodes, capacitors, and/or transistors linked together by electrical connections.

Formation of electronic circuits typically involves deposition of multiple layers of materials, including metals, insulators, dielectrics, and/or semiconductor materials, on the web. Deposition of multiple layers requires alignment between a pattern formed by a first layer of material on the web 101 and one or more subsequent layers deposited over the first layer pattern. The deposition system 100 may include a number of sensors 160 (shown in FIG. 1A) used to control the longitudinal and/or lateral movement of the web 101 to achieve alignment of the web 101 with the mask pattern prior to deposition. The movement of the web 101 may be adjusted to facilitate alignment between previously deposited patterns on the web 101 and the mask pattern.

Figure 1C:
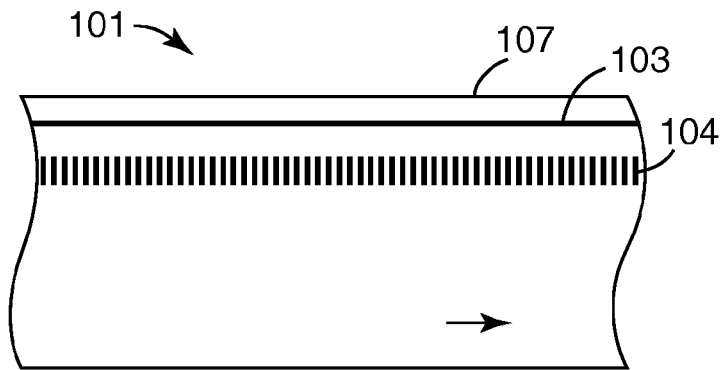
FIG. 1C shows an example of web markings that may be located on the web to control the lateral and longitudinal position of the web in accordance with an embodiment of the invention.

FIG. 1C shows an example of markings that may be located on the web 101 for purposes of controlling the lateral and longitudinal position of the web 101 and maintaining proper registration between the web 101 and the mask. These markings may be pre-patterned or may be added to the web 101 during a stage of the deposition process.

As shown in this example, the lateral or crossweb marking may be a line 103 that is a fixed distance from the location of deposition patterns to be formed on the web. An edge 107 of the web 101 may not be located in a precise relationship to the line 103 or any deposition patterns on the web 101. However, a web edge trimmed or marked for this purpose may be used for web alignment. From sensing the location of the line 103 in the lateral direction, it can be determined whether the web 101 is in the proper location or whether a web guide adjustment is necessary to realign the web 101 in the lateral direction.

As is also shown in this example, the longitudinal or machine direction web markings may be a series of cyclic marks 104 spaced a fixed distance from one another in the machine direction. From sensing the position of a cyclic mark 104 in the series, it can be determined whether the web 101 is at the proper longitudinal position relative to deposition patterns on the mask at a given point in time.

Figure 1D:
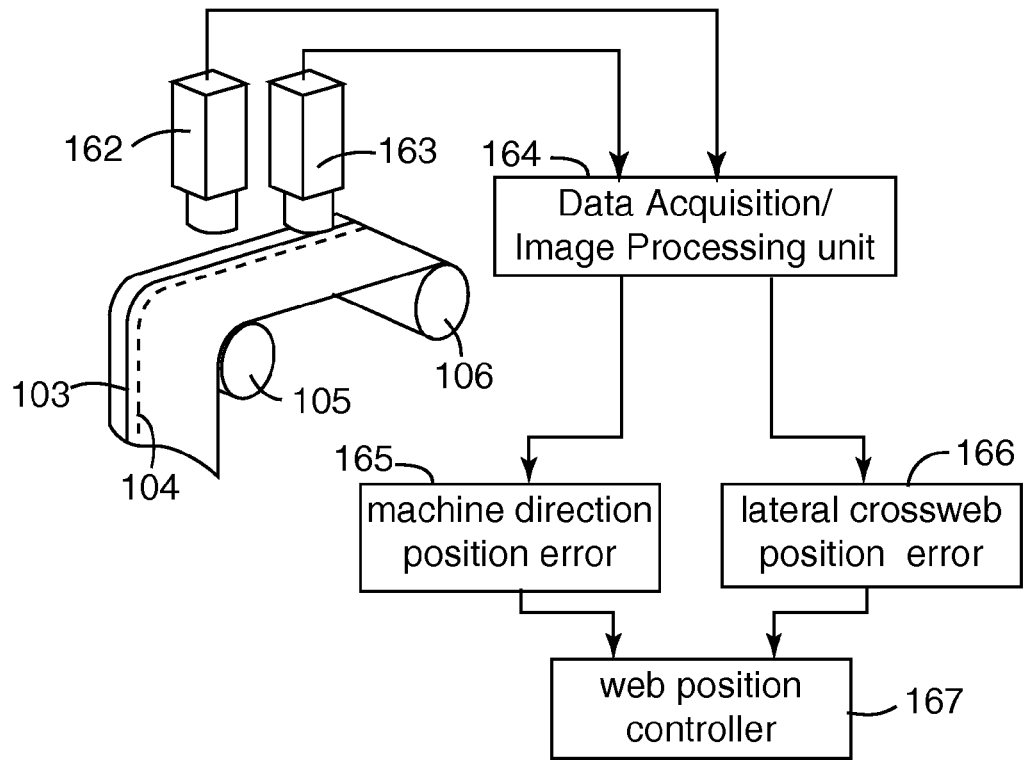
FIG. 1D is a block diagram of a position control system for a web in accordance with an embodiment of the invention.

FIG. 1D shows an illustrative embodiment of a position control system for a web 101. In this embodiment, one sensor 162 is being used for the lateral position control while another sensor 163 is being used for the longitudinal position control. The web 101 has longitudinal markings 104 and lateral markings 103 as described in connection with FIG. 1C. As the web 101 passes between unwind roller 106 and idler roller 105, the longitudinal web sensor 163 senses the longitudinal markings 104 while the lateral web sensor 162 senses the lateral marking 103. The web sensors 162, 163 may be implemented using a light emitting diode (LED) with a photodetector circuit or a camera, for example.

The output from the longitudinal web sensor 163 is provided to the data acquisition/image processing unit 164 which determines the longitudinal (machine direction) position error 165 of the web 101, i.e., how far the actual location of the web 101 is from the expected location. The position error for the longitudinal direction 165 is output to the web position controller 167 which has the capability to adjust the longitudinal position of the web to decrease the longitudinal position error 165.

The output from the lateral web sensor 162 is provided to the data acquisition/image processing unit 164. The data acquisition/image processing unit 164 determines the error in the lateral position 166 of the web, i.e., how far the actual location of the lateral marking 103 is from the expected location. The position error 166 for the lateral or crossweb direction is output to the web position controller 167 which has the capability to adjust the lateral position of the web to decrease the lateral position error 166.

Figure 2A:
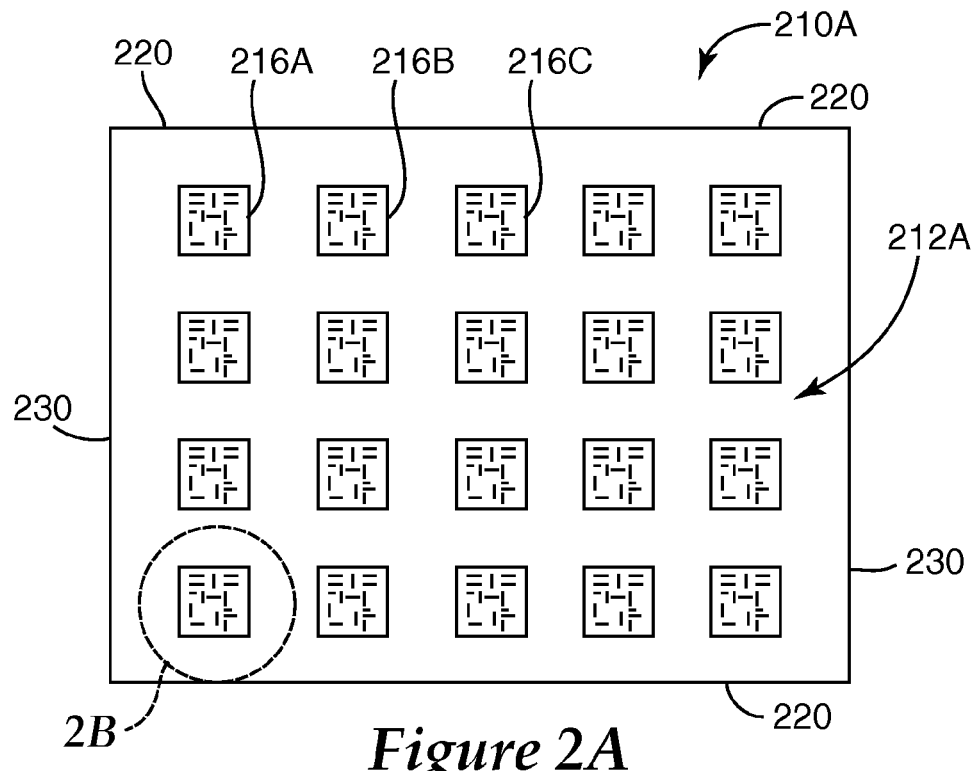
FIGS. 2A and 2B illustrate an aperture mask that may be utilized in a deposition system in accordance with embodiments of the invention.
Figure 2B:
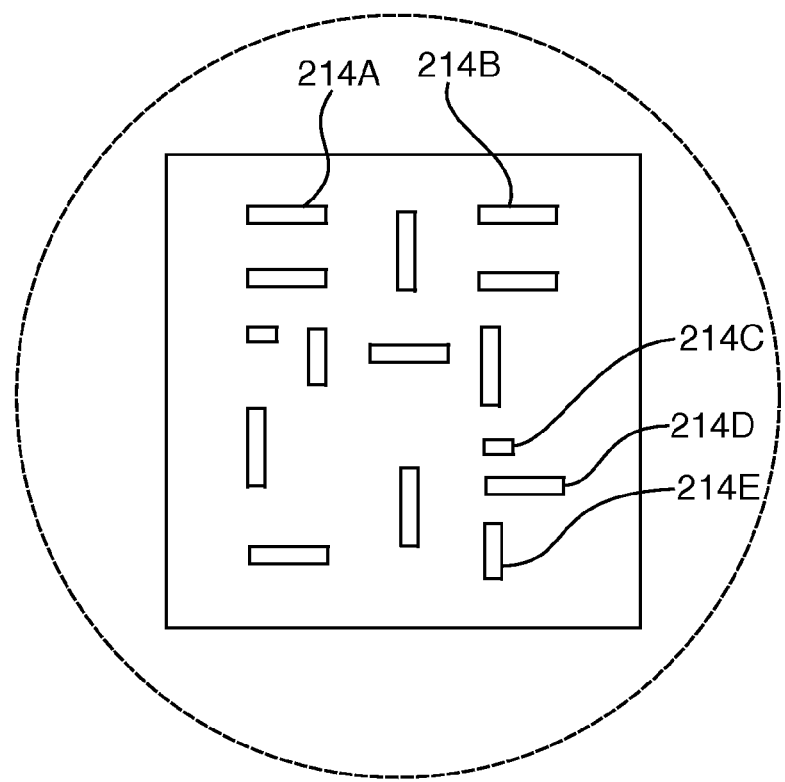

As shown in FIGS. 2A and 2B, an aperture mask 210A is formed with a pattern 212A that defines a number of apertures 214 (only apertures 214A-214E are labeled). Aperture mask 210A includes edges 220 and ends 230, wherein the edges 220 are substantially parallel to the longitudinal axis of the mask 210A and the edges 220 are substantially parallel to the transverse axis of the mask 210A.

The arrangement and shapes of apertures 214A-214E in FIG. 2B are simplified for purposes of illustration, and are subject to wide variation according to the application and circuit layout. Pattern 212A defines at least a portion of a circuit layer and may generally take any of a number of different forms. In other words, apertures 214 can form any pattern, depending upon the desired circuit elements or circuit layer to be created in the deposition process using aperture mask 210A. For example, although pattern 212A is illustrated as including a number of similar sub-patterns (sub-patterns 216A-216C are labeled), the invention is not limited in this respect.

Aperture mask 210A can be used in a deposition process, such as a vapor deposition process in which material is deposited onto a substrate through apertures 214 to define at least a portion of a circuit. Advantageously, aperture mask 210A enables deposition of a desired material and, simultaneously, formation of the material in a desired pattern. Accordingly, there is no need for a separate patterning step preceding or following deposition. Aperture mask 210A can be used to deposit small circuit features allowing the formation of high density circuits. Aperture mask 210A may be formed from a polymeric film such as by using laser ablation to define pattern 212A of deposition apertures 214. The formation and use of polymeric film aperture masks in deposition systems are further described in commonly owned U.S. Pat. No. 6,897,164, U.S. Patent Application Publication 2003/0151118, and U.S. patent application Ser. No. 11/179,418, filed Jul. 12, 2005 which are incorporated herein by reference.

Figure 3A:
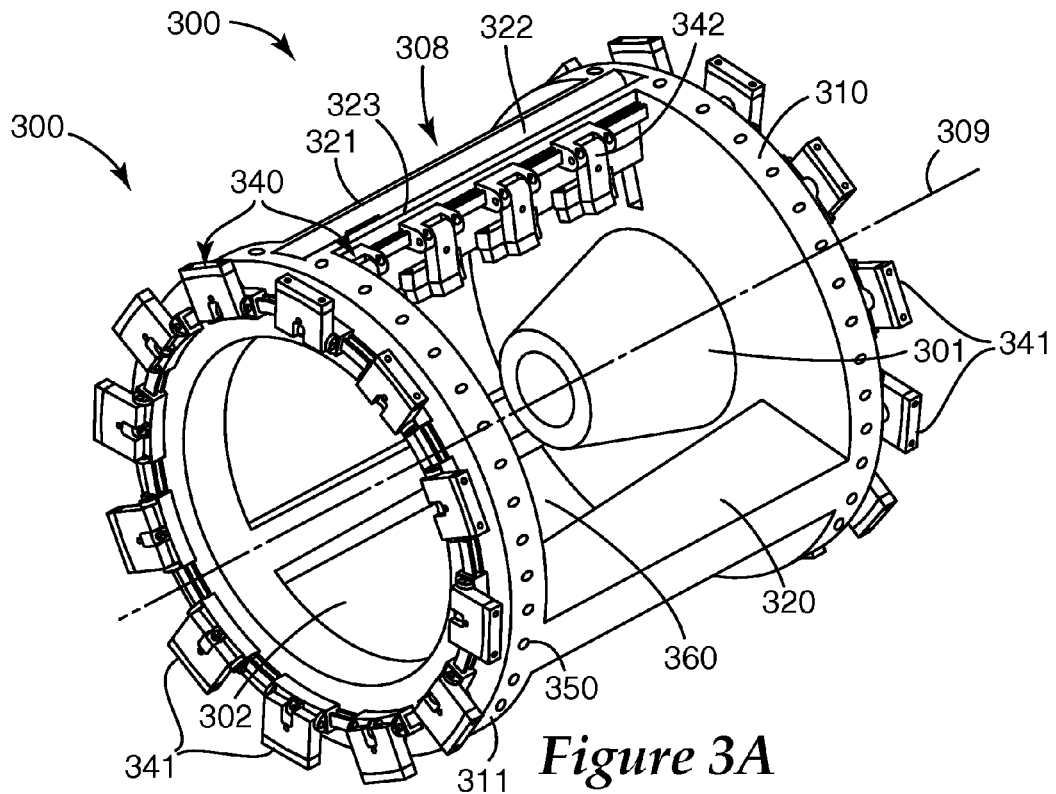
FIG. 3A illustrates a mask assembly absent the aperture mask in accordance with an embodiment of the invention.
Figure 3B:
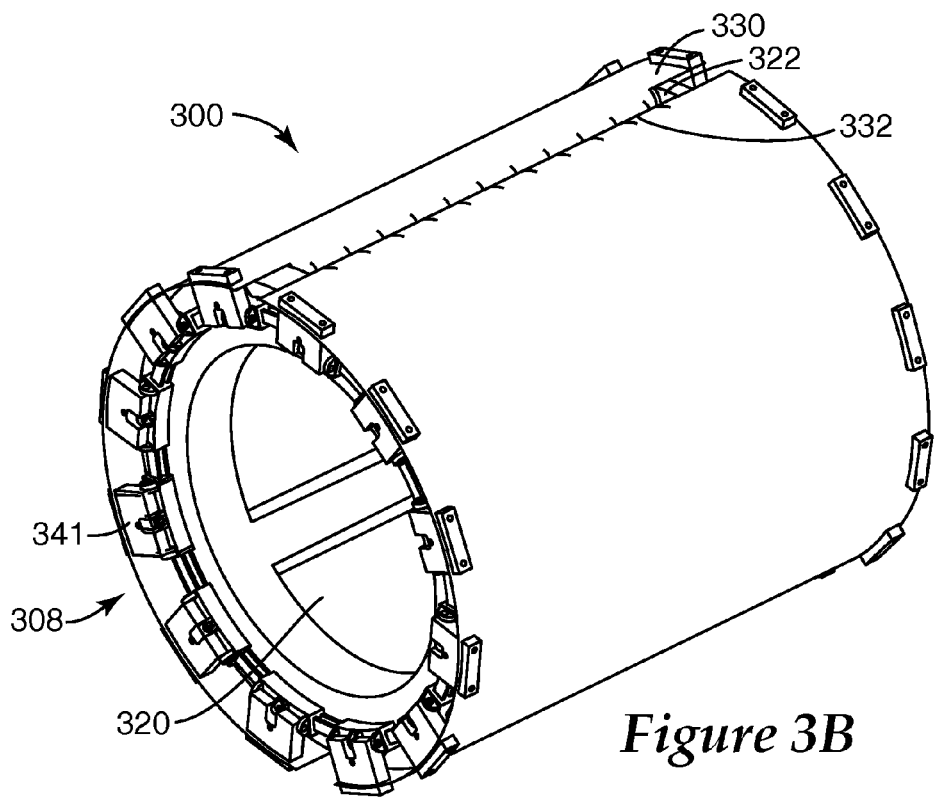
FIG. 3B illustrates the mask assembly of FIG. 3A after the aperture mask is installed in the clamping arrangement in accordance with an embodiment of the invention.

FIGS. 3A and 3B illustrate components of a rotatable aperture mask assembly 300 in accordance with an embodiment of the invention. FIG. 3A illustrates the frame 308 and clamping arrangement 340 of the aperture mask assembly 300 absent the aperture mask. FIG. 3B illustrates the aperture mask assembly 300 with the aperture mask 330 installed, absent the apertures. In this embodiment, the aperture mask assembly 300 includes two frame end structures 310, 311 coupled by beams 320, 321, 323 forming a hollow frame. One frame end structure 310 includes a fixture 301 for coupling to a drive mechanism (not shown) that rotates the aperture mask assembly 300. Another frame end structure 311 includes one or more openings 302 configured to allow insertion and removal of deposition sources (not shown) to and from the interior of the mask assembly 300.

An aperture mask 330 (shown in FIG. 3B) conforms to the shape defined by the frame 308, which in this example is a cylindrical shape. Apertures in the mask 330 are aligned with openings 360 of the frame 308 to allow deposition material emanating from a source in the interior of the frame 308 to reach the web. The aperture mask 330 is held by a clamping arrangement 340 that tensions the mask. The clamping arrangement 340 includes one or more edge clamps 341 positioned along the perimeter of one or both frame end structures 310, 311 to tension the mask along a direction substantially parallel to an axis 309 of the frame 308. The edge clamps 341 are configured to clamp edges of the aperture mask 330. The frame end structures 310, 311 may include holes 350 which are in fluidic connection with a gas manifold (not shown). Application of a gas, such as argon, or other inert gas, through holes 350 facilitates positioning of the mask 330 on end structures 310, 311 during mask installation.

As illustrated in FIG. 3A, the clamping arrangement 340 also includes one or more end clamps 342 that secure the ends of the aperture mask 330. The end clamps 342 are used to apply tension to the aperture mask 330 around the circumference of the frame 308 along the perimeter path of the aperture mask 330. In one embodiment, two of the beams 321, 323 are arranged to form a slot 322 into the interior of the frame 308. At least one of the beams 323 supports end clamps 342. Ends of the aperture mask 330 are inserted through the slot 322 and are held by clamps 342. In one embodiment, a first set of end clamps 342 are arranged relative to a first beam 323 forming slot 322. A second set of end clamps (not shown) are arranged relative to a second beam 321 forming slot 322. The first set of clamps 342 are used to secure a first end of the aperture mask 330 and the second set of clamps (not shown) are used to secure a second end of the aperture mask 330.

Figure 3C:
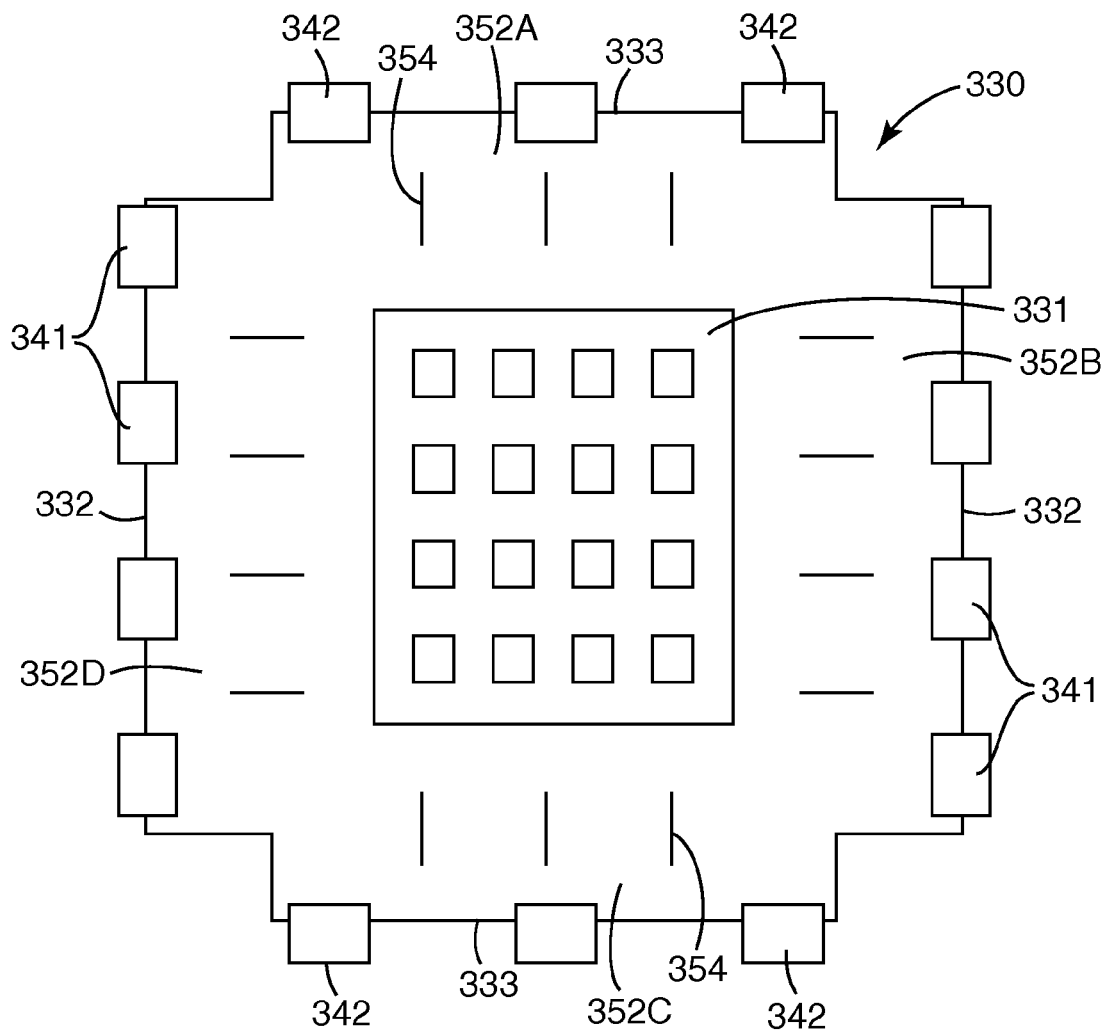
FIG. 3C illustrates a flat projection view of an aperture mask, end clamps, and edge clamps in accordance with an embodiment of the invention.

FIG. 3C illustrates a flat projection view of the aperture mask 330 and clamping arrangement 340 previously described in connection with FIGS. 3A and 3B. The mask 330 may include extension portions 352A-352D along the edges 332 and/or ends 333 of the mask 330. The edges 332 of the mask 330 are clamped by edge clamps 341. The ends 333 of the mask 330 are clamped by end clamps 342.

The extension portions 352A-352D are used to stretch the mask 330 to appropriately tension the pattern area 331 without excessive distortion. In some implementations, the main cross shaped membrane of the mask 330 may include, for example, a metal or plastic backing adhered or laminated onto polyimide. In one implementation, the pattern area 331 has the backing removed, such as by etching.

In one embodiment, the mask 330 is polyimide having a thickness of about 1 mil, and having metal plating on extension portions 352A-352D outside the pattern area 331. Metal plating on the extension portions 352A-352D facilitates clamping, provides more uniform stress distribution, and provides for conduction of heat away from the pattern area 331. In an alternative embodiment, the mask 330 does not include metal plating.

Each extension portion 352 may include a set of distortion minimizing features 354, such as slits, which may be located near the edge of pattern area 331. The distortion minimizing features can facilitate more precise stretching of aperture mask 330 by reducing distortion of pattern area 331 during stretching. Various configurations of distortion minimizing features 354 include slits, holes, perforations, reduced thickness areas, and the like.

Figure 4A:
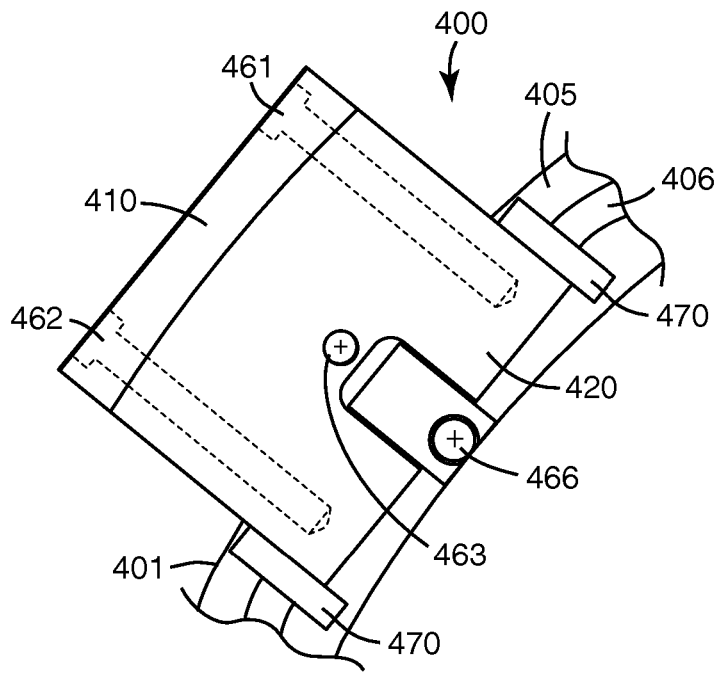
FIGS. 4A and 4B illustrate end and section views, respectively, of a mask edge clamp in accordance with an embodiment of the invention.
Figure 4B:
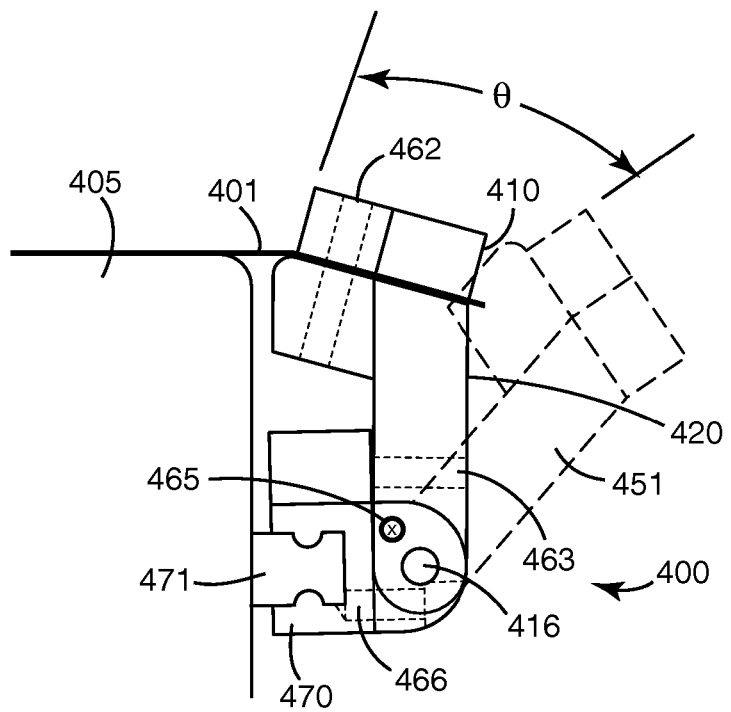

FIGS. 4A and 4B illustrate side views of an edge clamp 400 mounted on a frame end structure 405 in accordance with one embodiment of the invention and an end clamp 420. It is to be understood that an aperture mask assembly may include a number of clamps having the configuration of clamp 400. The clamp 400 is coupled to the frame end structure 405 through a bearing block 464 mounted on a rail 406. The bearing block 464 is configured to slide along the rail 406 allowing the position of the clamp 400 to be adjusted along the perimeter of the end structure 405. Positional adjustment of the clamps 400 along the perimeter of the end structure provides for aligning the mask 401 with respect to the frame and frame openings and/or provides for maintaining the helical alignment of the mask 401 to within acceptable tolerance limits when the entire assembly is rotated.

The clamp 400 includes first and second clamp jaws 410 and 420 that are configured to grasp an edge of the aperture mask 401. In the embodiment illustrated in FIG. 4A, the first clamp jaw 410 is separable from the second clamp jaw 420. The mask 401 is inserted between the first clamp jaw 410 and the second clamp jaw 420. After insertion of the mask 401, the first and second clamp jaws 410, 420 may be coupled by screws 461, 462 or by other attachment arrangements.

The clamp 400 is attached to the bearing block 464 by hinges 470 including hinge pin 416. The clamp 400 is rotatable about the hinge pin 416. Once the mask is grasped by the clamp jaws 410, 420, the angular (θ) displacement of the clamp 400 may be adjusted, as shown by the dashed outline 451. Angular displacement of the clamp 400 provides significant control over the mask tension. For example, the mask tension may be maintained between about 0.1% strain and about 0.6% strain.

In some implementations, the rotation of the clamp 400 about the hinge pin 416 may be manually adjusted, such as by turning a set screw 463. In other implementations the tension in the mask 401 may be adjusted using gearmotors or other types of actuators (not shown) coupled to an adjustment mechanism, such as a threaded rod or bolt. The gearmotors or actuators may alter the rotation of the clamp 400 about the hinge pin 416 based on feedback from sensors used to dynamically measure the mask tension and/or position during adjustment. The aperture mask 401 can be designed in such a way to allow position feedback of mask fiducials to precisely monitor and control tension.

The angular position of the clamp 400 may be fixed, for example, using set screw 465 inserted through hinge 470 and contacting the second clamp jaw 420. The position of the clamp 400 along the perimeter of the frame end structure 405 may be fixed, for example, using set screw 466 inserted through the bearing block 464 and contacting the rail 406 or the frame end structure 405.

Figure 5:
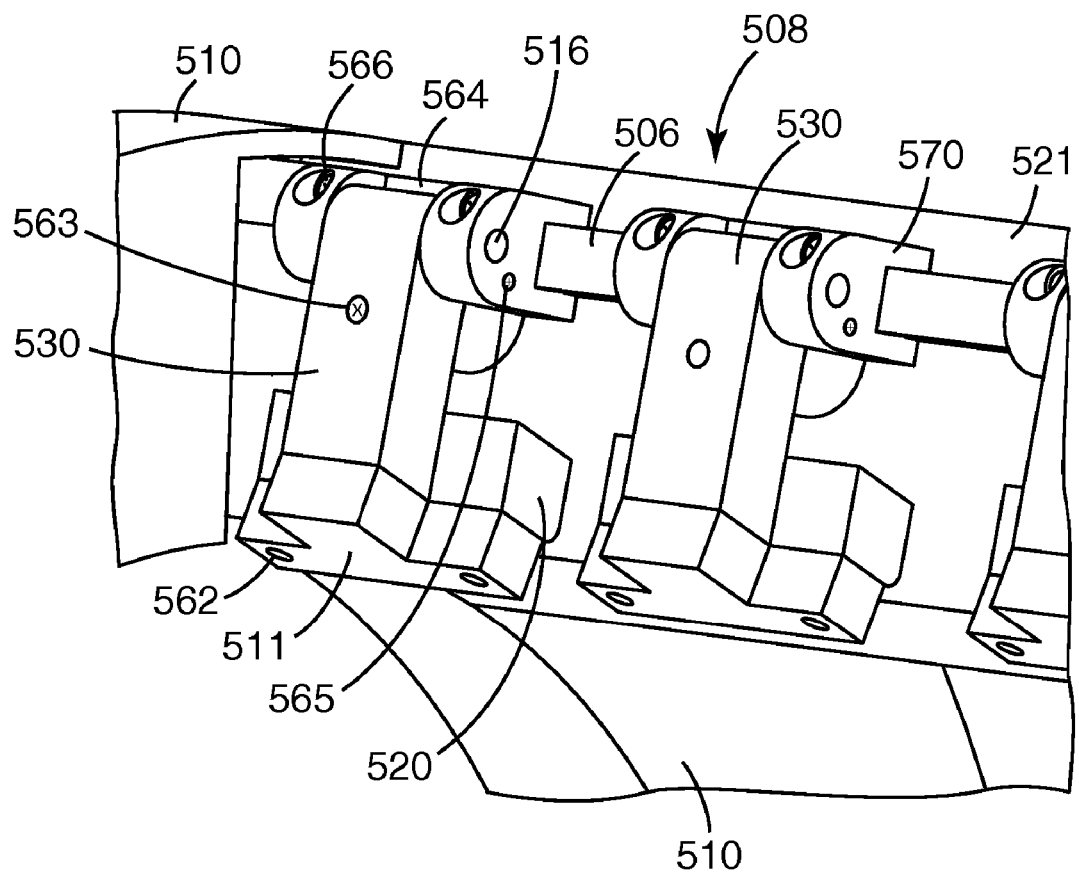
FIG. 5 illustrates an exemplary configuration for mask end clamps in accordance with an embodiment of the invention.

FIG. 5 illustrates in more detail an exemplary configuration for end clamps 530 that may be used to hold the ends of the aperture mask (not shown in FIG. 5). FIG. 5 shows portions of the frame 508, including frame end structure 510 and the beam 521. The end clamps 530 are coupled to the beam 521 through bearing blocks 564 mounted on a rail 506. The bearing blocks 564 are configured to slide along the rail 506 allowing the position of the clamps 530 to be adjusted along the beam 521. Positional adjustment of the clamps 530 along the beam 521 provides for appropriate alignment of the mask with respect to the frame and frame openings.

Ends of the aperture mask (not shown in FIG. 5) are inserted through the slot between the beams and are grasped by end clamps 530. The end clamps 530 include first and second clamp jaws 511 and 520 that are configured to grasp the ends of the aperture mask. In some embodiments, such as the exemplary embodiment illustrated in FIG. 5, the first clamp jaw 511 is separable from the second clamp jaw 520, although clamping arrangements that do not include completely separable jaws may be envisioned. The mask is inserted between the first clamp jaw 511 and the second clamp jaw 520. After insertion of the mask, the first and second clamp jaws 511, 520 may be bolted together via screws 562 or may be coupled together using other attachment arrangements.

The bearing blocks 564 include hinges having hinge supports 570 through which hinge pins 516 are inserted. Each clamp 530 is individually rotatable about its respective hinge pin 516. Once the mask is grasped by the clamp jaws 511, 520, the clamps 530 may be rotated to adjust the mask tension. The rotation of the clamps 530 may be manually or automatically performed as described herein. Rotation of the clamps 530 may be accomplished manually using set screws 563. The angular displacement of the clamps 530 may be fixed using set screws 565 inserted through hinge supports 570 and contacting the clamps 530. The position of the clamps 530 along the beam 521 may be fixed, for example, using set screws 566 inserted through the hinge supports 570 and contacting the rail 506 or beam 521.

Figure 6A:
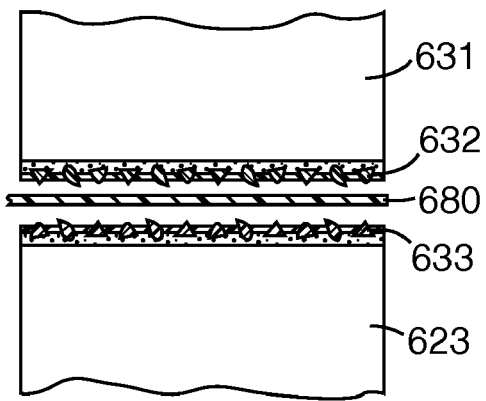
FIGS. 6A and 6B illustrate mating surfaces used for end clamps and/or edge clamps in accordance with embodiments of the invention.
Figure 6B:
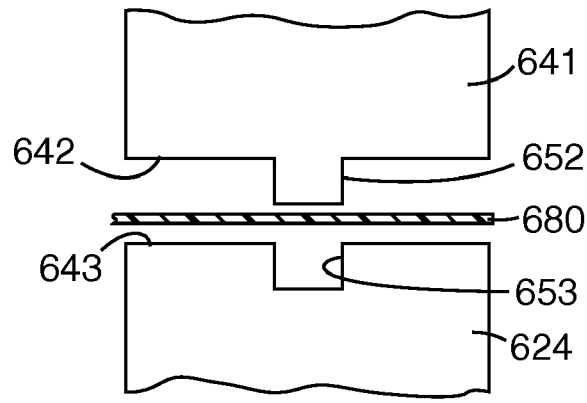

FIGS. 6A and 6B illustrate mating surfaces that may be used for mask end clamps and/or mask edge clamps to facilitate mask clamping in accordance with various embodiments. In one embodiment, illustrated in FIG. 6A, the edge and/or end clamps include an abrasive surface to enhance secure clamping. The surface roughness of the mating surfaces 632, 633 provides enhanced frictional contact between the mating surfaces 632, 633 and the aperture mask 680 to provide secure clamping of the mask 680. FIG. 6A shows the mating surfaces 632, 633, respectively, of first and second jaws 631, 623 of a clamp. In this embodiment, the mating surfaces 632, 633 of the first and second jaws 631, 623 are textured, for example, by application or formation of a layer on one or both jaws 631, 623 to provide the requisite amount of surface roughness.

In some embodiments, the surface roughness may be achieved using sandpaper adhered to faces of one or both clamp jaws 631, 623 via an adhesive, such as an acrylate based adhesive, or other type of adhesive. The sandpaper should have high enough grit count per unit area so as to not penetrate the aperture mask. In other embodiments, the requisite surface roughness may be achieved by texturing the faces of one or both clamp jaws 631, 623 such as through microreplication, grinding, or embossing.

FIG. 6B illustrates first and second jaws 641, 624 having mating surfaces 642, 643 that include complementary features 652, 653 configured to engage the aperture mask 680 between the features 652, 653 to clamp the mask 680 securely. The complementary features 652, 653 illustrated in FIG. 6B include a rectangular key 652 and slot 653, although other configurations of complementary features are possible.

Figure 6C:
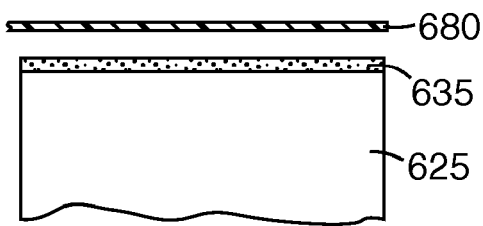
FIG. 6C illustrates attachment of the mask to the frame by an adhesive applied to the frame in accordance with an embodiment of the invention.
Figure 6D:
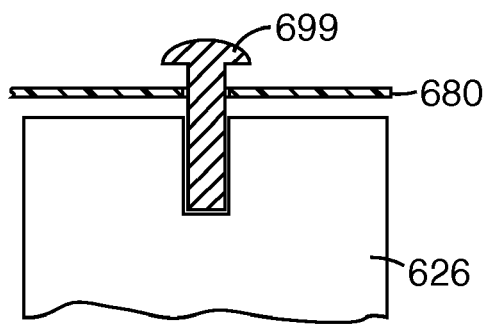
FIG. 6D illustrates attachment of the mask to the frame by screws or rivets in accordance with embodiments of the invention.

Some embodiments involve securing the mask to the frame by adhesive or by other attachment mechanisms such as screws or rivets. In FIG. 6C, the mask 680 is secured to the surface of the frame 625 by a layer of adhesive 635. In FIG. 6D, the mask 680 is secured to the surface of the frame 626 using screws 699. Various methods of attaching the mask to the frame may be envisioned and are considered to be within the scope of the present invention.

Figure 7:
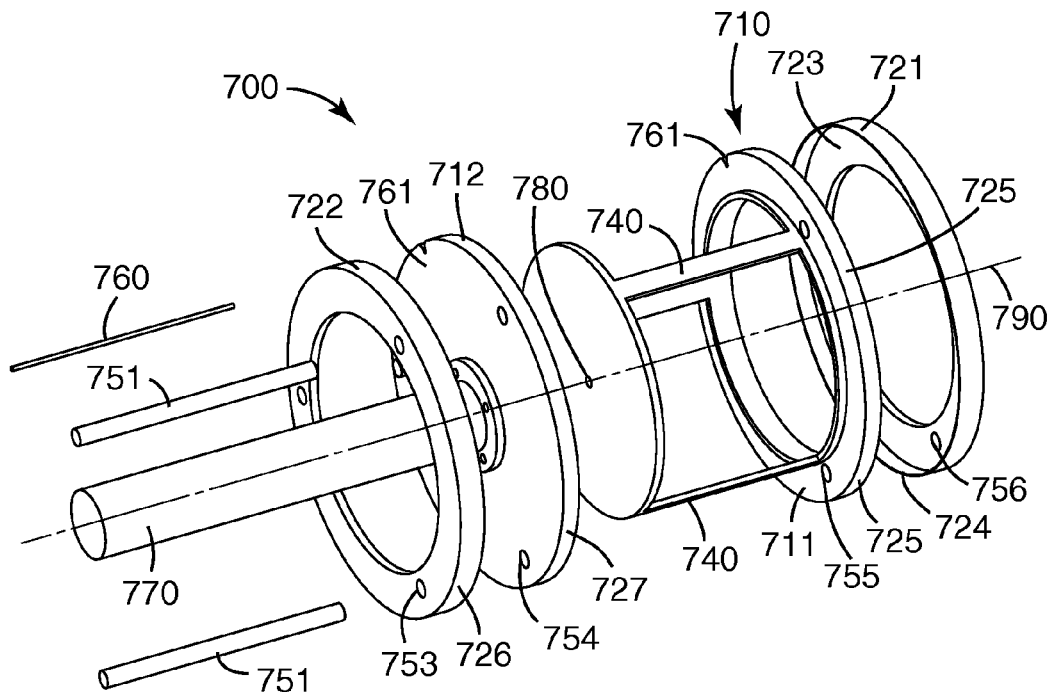
FIG. 7 illustrates a mask assembly using end caps in a clamping arrangement in accordance with an embodiment of the invention.

FIG. 7 illustrates a rotatable aperture mask assembly 700 without the aperture mask installed in accordance with another embodiment. The aperture mask assembly 700 includes a frame 710 comprising frame end structures 711, 712 and beams 740. One frame end structure 712 is attached to a shaft 770. The shaft 770 is coupled between a drive mechanism (not shown) and the aperture mask assembly 700 to allow rotation of the aperture mask assembly 700 by the drive mechanism. In this embodiment, clamp elements, such as end caps 721, 722, are used to clamp the mask between the clamp elements and the end structures 712 of the frame.

The aperture mask assembly 700 of this embodiment includes end caps 721 and 722 that include recessed regions 723. Frame end structure 711 fits within the recessed region 723 of end cap 721. Frame end structure 712 fits within the recessed region 723 of end cap 722. End cap 722 and frame end structure 712 form a mask clamping apparatus at one end of the mask assembly 700 that is configured to clamp a first edge of the aperture mask. The first edge of the aperture mask is secured between the end cap 722 and the frame end structure 712 as frame end structure 712 fits within the recessed region 723 of the end cap 722. A lip 726 of end cap 722 fits over the outer surface 727 of frame end structure 712.

At the opposite end of the mask assembly 700, end cap 721 and frame end structure 711 form a mask clamping apparatus used to clamp a second edge of the aperture mask. The second edge of the aperture mask is secured between the end cap 721 and frame end structure 711 as the frame end structure 711 fits within the recessed region 723 of the end cap 721. A lip 724 of end cap 721 fits over the outer surface 725 of frame end structure 711. The mask clamping apparatus may also include an adjustable band (not shown) around the circumference of one or both end caps 721, 722, such as a hose clamp, to provide additional clamping force. The inside surface of the recessed regions 723 of the end caps 721, 722 and/or the outer surfaces 727, 725 of the frame end structures 712, 711 may include surface enhancements that facilitate secure clamping of the mask, such as the surface enhancements described in connection with FIGS. 6A-6D.

Clamping of the mask is achieved by wrapping the mask over the perimeter of the frame 710 and frame end structures 711, 712. The end caps 721 and 722 fit tightly over the frame end structures 711, 712 and the edges of the mask, pinning the edges of the mask in place. Rods 751 inserted through the holes 753-756 of the end caps, 721, 722, and frame end structures 711, 712 maintain alignment of mask assembly components.

Tension in the mask along an axis 790 of the frame may be adjusted by increasing the distance between the frame end structures 711, 712. In one embodiment, mask tension is increased or decreased by turning an adjustment bolt (not shown) inserted through access hole 780. The adjustment bolt and frame end structures 711, 712 may be arranged so that tightening the adjustment bolt produces an axial force opposing both of the frame end structures 711, 712, axially extending the aperture mask assembly 700, and thereby tensioning the mask substantially parallel to an axis 790 of the frame 710.

In the embodiment illustrated in FIG. 7A, a mask end clamping apparatus is formed by pin 760 which is inserted into notches 761 in frame end structures 711, 712. Ends of the mask are folded over pin 760 and pin 760 is inserted into notches 761. The end caps 721, 722 fit over the frame end structures 711, 712, locking the pin 760 into notches 761, thereby securing ends of the mask in place.

Figure 8:
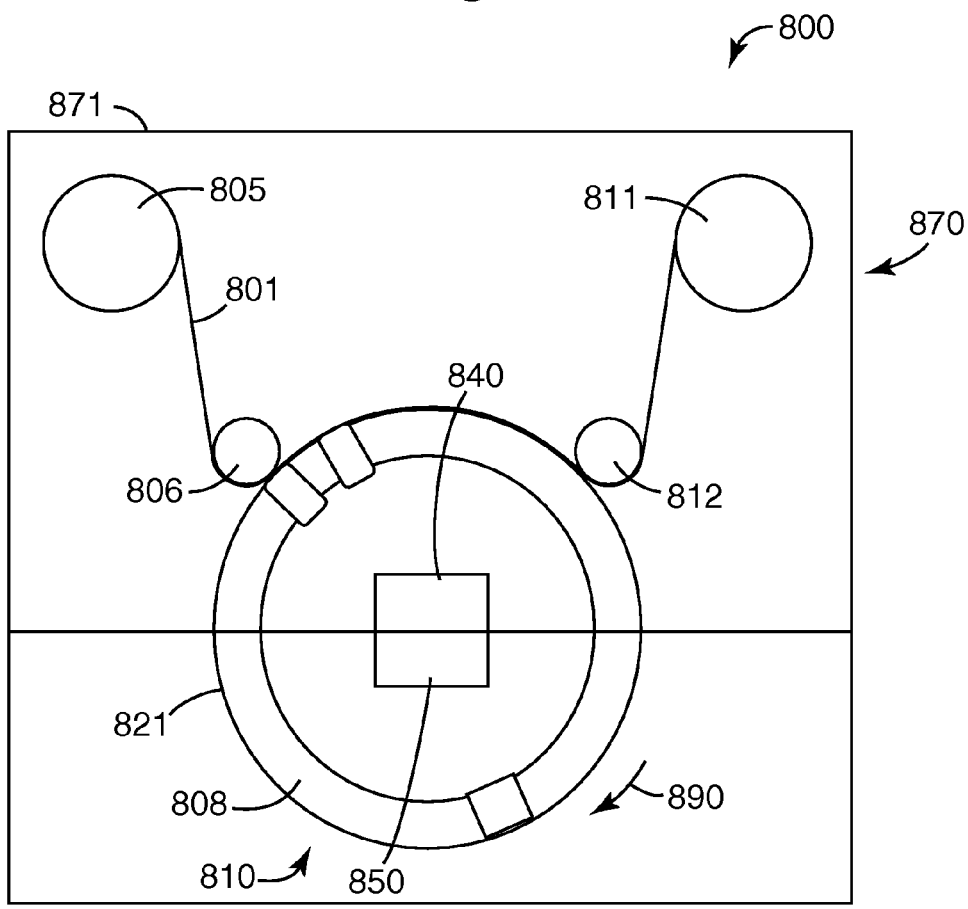
FIG. 8 illustrates a deposition system including a mechanism for cleaning the mask assembly in accordance with an embodiment of the invention.

The deposition process may cause significant buildup of deposition material on the mask and/or frame necessitating eventual cleaning or disposal of the mask and/or frame. FIG. 8 illustrates a deposition system 800 including a mechanism for cleaning the aperture mask assembly 810 in accordance with an embodiment of the invention. The system 800 includes a dual section chamber 870 having a deposition chamber 871 and a cleaning chamber 872. The aperture mask assembly 810 rotates 890 within the deposition and cleaning chambers 871, 872 so that a portion of the aperture mask assembly 810 is positioned within the deposition chamber 871 while another portion of the aperture mask assembly 810 is positioned within the cleaning chamber 872. The aperture mask assembly 810 comprises a rotating frame 808 having at least one opening. An aperture mask 821 conformable to a shape defined by the frame 808 is tensioned by a clamping arrangement including one or more aperture edge clamp arrangements and one or more aperture end clamp arrangements as previously described.

Apertures of the mask 821 are aligned with openings in the frame 808 to allow deposition of material from a deposition source 840 positioned within the frame 808 to coat the web substrate 801 through the apertures of the frame 808.

The configuration illustrated in FIG. 8 allows for simultaneous use and cleaning of the aperture mask assembly 810. The portion of the aperture mask assembly 810 occupying the deposition chamber 871 may be used in the deposition process, while, possibly simultaneously, the portion of the aperture mask assembly 810 occupying the cleaning chamber 872 is cleaned. As the aperture mask assembly 810 rotates 890, the cleaned portion moves into the deposition chamber 871 and the used portion moves into the cleaning chamber 872.

The deposition chamber 871 encloses a web transport system 820 and a deposition source 840. As previously described, a web transport system moves the web 801 in relation to the deposition source 840 during the deposition process. The web 801 is arranged on an unwind roller 805 that delivers the web 801 to the remainder of the deposition system 800. In this embodiment, the web 801 travels over a first idler roller 806, around a portion of a circumference of a rotating frame 808, over a second idler roller 812, and is collected by a wind roller 811.

The cleaning chamber 872 encloses a cleaning source 850, such as a plasma etching source, ion-beam etching source, reactive etching source, evaporation source, heating source, or other cleaning sources. One or both of the deposition chamber 871 and cleaning chamber 872 may or may not be evacuated. Different vacuum levels may be maintained in each chamber 871, 872.

The foregoing description of the various embodiments of the invention has been presented for the purposes of illustration and description. It is not intended to be exhaustive or to limit the invention to the precise form disclosed. Many modifications and variations are possible in light of the above teaching. For example, embodiments of the present invention may be implemented in a wide variety of applications. It is intended that the scope of the invention be limited not by this detailed description, but rather by the claims appended hereto.

What is claimed is:

1. A deposition system, comprising:
    a chamber including a deposition region;
    a rotatable frame assembly disposed within the chamber, the frame assembly comprising:
        a frame comprising:
            two end structures; and
            one or more beams coupling the end structures;
        a mask having one or more apertures; and
        a clamping arrangement configured to tension the mask and to conform the mask to a shape defined by the frame, wherein the clamping arrangement includes a clamping element configured to clamp an edge of the mask between the clamping element and the frame, wherein the clamping arrangement comprises one or more edge clamps positioned on one or both of the two end structures, and wherein each edge clamp is coupled to one of the two end structures through a bearing block mounted on a rail;
    a deposition source disposed within the deposition region; and
    a web drive mechanism configured to move a web in relation to the deposition source to allow deposition of a material from the deposition source onto the web through the apertures of the mask.

2. The deposition system of claim 1, wherein the frame is substantially cylindrical.

3. The deposition system of claim 1, wherein the deposition source is positioned within the frame and openings in the frame allow deposition of the material from the deposition source through the mask.

4. The deposition system of claim 1, wherein the deposition source comprises at least one of an e-beam deposition source, a thermal evaporation source, a sputter cathode source, a vapor deposition source, or a liquid deposition source.

5. The deposition system of claim 1, wherein the mask is removable from the frame.

6. The deposition system of claim 1, wherein the frame assembly is removable from the chamber.

7. The deposition system of claim 1, wherein the chamber further comprises a cleaning region and the rotatable frame is configured to rotate within the deposition region and the cleaning region of the chamber.

8. The deposition system of claim 7, further comprising a cleaning source positioned within the cleaning region and within the frame.

* * * * *